(12) United States Patent (10) Patent No.: US 6,709,524 B2
Kawashima (45) Date of Patent: Mar. 23, 2004

(54) VAPOR DEPOSITION METHOD AND VAPOR DEPOSITION APPARATUS FOR FORMING ORGANIC THIN FILMS

(75) Inventor: Toshitaka Kawashima, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/338,503

(22) Filed: Jan. 8, 2003

(65) Prior Publication Data

US 2003/0131796 A1 Jul. 17, 2003

Related U.S. Application Data

(62) Division of application No. 09/993,091, filed on Nov. 6, 2001, now Pat. No. 6,559,065.

(30) Foreign Application Priority Data

Nov. 7, 2000 (JP) ........................................ 2000-339458

(51) Int. Cl.[7] .............................................. C23C 14/00
(52) U.S. Cl. ........................ 118/726; 392/386; 392/387; 392/388; 392/389
(58) Field of Search .................... 118/726; 392/386–389

(56) References Cited

U.S. PATENT DOCUMENTS

| | | | |
|---|---|---|---|
| 4,737,232 A | | 4/1988 | Flicstein et al. |
| 6,237,529 B1 | * | 5/2001 | Spahn ........................ 118/726 |
| 6,275,649 B1 | * | 8/2001 | Nagashima et al. ........ 392/389 |

* cited by examiner

*Primary Examiner*—Richard Bueker
(74) *Attorney, Agent, or Firm*—Frommer Lawrence & Haug LLP; William S. Frommer; Samuel H. Megerditchian

(57) ABSTRACT

In order to provide a vapor deposition method for forming an organic thin film, which is advantageous in that a deposition rate can be easily controlled and deposition can be conducted with stable high controllability, there is prepared a crucible which is provided with an opening portion at an upper portion of the body, and a projection in a cone shape on an inner bottom surface of the crucible so as to be opposite to the opening portion. When the crucible is irradiated with an infrared light from the bottom side of the crucible, the light in one region among the infrared light transmits the bottom of the crucible and is then radiated to an organic material contained in the crucible. Therefore, the organic material is heated and vaporized at a desired temperature in the range of about 100 to 400° C. by controlling the irradiation dose of the infrared light.

4 Claims, 6 Drawing Sheets

VAPOR DEPOSITION METHOD AND VAPOR DEPOSITION APPARATUS FOR FORMING ORGANIC THIN FILMS

This application is a divisional of application Ser. No. 09/993,091, filed Nov. 6, 2001, now U.S. Pat. No. 6,559,065.

CROSS REFERENCES TO RELATED APPLICATIONS

The present document is based on Japanese Priority Document JP 2000-339458, filed in the Japanese Patent Office on Nov. 7, 2000, the entire contents of which being incorporated herein by reference.

BACKGROUND OF THE INVENTION

1. Field of the Invention

The present invention relates to a vapor deposition method for forming an organic thin film used in organic electroluminescence (EL) devices. The present invention is also concerned with a vapor deposition apparatus for forming an organic thin film.

2. Description of the Related Art

EL devices are light emission devices utilizing an EL (electroluminescence) phenomenon such that a light emission occurs when an electric field is applied to a fluorescent substance, and they are generally classified into one in which a light emission occurs due to a collision of accelerated electrons with the radiative recombination center of the fluorescent substance placed in an electric field, and one in which electrons entering a semiconductor crystal having a fluorescence property cause a light emission at the pn junction interface. In the latter, a voltage is applied to a pn junction comprised of a semiconductor crystal, such as GaAs (red) or GaP (green), to combine a hole and an electron at the interface. This is a so-called light emission diode, and has a high light emission efficiency and therefore is now widely extended in a display application. In addition, in recent years, a blue light emission using GaN or AlGaN has been accomplished, and light emission devices are being spread in further applications including a full-color display. Thus, there exist a number of materials for EL devices, and, in addition to the above-mentioned semiconductors, many organic materials have been developed.

Organic EL devices basically have a structure such that organic thin films are stacked on one another, specifically a structure such that, on a glass substrate, an anode comprised of, for example, an indium-tin oxide (ITO), an organic hole transport layer, an organic light emission layer, and a cathode comprised of a metal are successively stacked on one another. For forming a thin film, the deposition for such organic EL materials has conventionally been conducted by a resistive heating deposition method (see, for example, Y. Hamada, C. Adachi, T. Tsutsui, S. Saito, J. Appl. Phys. Jpn., 31, 1812 (1992); and Y. Ohmori; A. Fujii, M. Uchida, C. Morishima, K. Yoshino, Appl. Phys. Lett., 62, 3250 (1993)). This deposition method is inherently a method employed when preparing metal thin films, for example, aluminum (Al) electrode wiring, and this is a method in which a substance to be deposited is placed in a boat made of a metal, such as molybdenum (Mo) or tantalum (Ta), and the boat is heated by passing a current through the boat to heat and evaporate the substance to be deposited, and the resultant vapor is deposited on the substrate to form a thin film. This method is easy, and excellent in film thickness controllability, and, especially when this method is applied to deposition in vacuum, a thin film having a clean surface can be prepared.

However, the resistive heating deposition method which has been employed for the deposition of metals is not necessarily suitable for the deposition of organic materials. Specifically, the resistance heating is conducted by passing a current through a filament provided in a bottom portion of a boat made of a metal, and, for this reason, a material contained in the boat is locally heated from the bottom side of the boat. Therefore, the whole of the material cannot be uniformly heated. Further, when a plurality of deposition sources are used, it is extremely difficult to keep constant the heating state of materials contained in the respective deposition sources. In addition, the temperature of the boat being heated rapidly rises to a temperature as high as about 1,000° C., and hence the temperature control for the boat is difficult. When an organic material having a vaporization temperature of about 100 to 400° C. is heated in such a boat, the organic material is partially crystallized, decomposed, or deformed in the boat and the remaining organic material is evaporated all together, thus causing the control of the deposition rate to be difficult.

By the vapor deposition method for forming an organic thin film of the present invention, an organic material is heated by the infrared light and is vaporized to be deposited on a substrate. Therefore, the vapor amount of the organic material, that is, the deposition rate is controlled by adjusting the heating temperature for the organic material, so that the deposition can be conducted at an arbitrary deposition rate in the range of temperatures as low as 100 to 400° C. Thus, a deposition rate can be easily controlled with excellent response.

In addition, in the vapor deposition method for forming an organic thin film of the present invention, the crucible is provided with a projection inside the crucible on the side from which the infrared radiation enters. Therefore, a part of the infrared light undergoes total reflection off the projection and is then radiated to the inside of the crucible, so that the vapor of the organic material is prevented from being solidified again on the inner sidewall and inner upper surface of the crucible and the organic material is uniformly heated, thus making it possible to obtain a stable deposition rate.

Further, by the vapor deposition apparatus for forming an organic thin film of the present invention, the organic material can be uniformly heated, making it possible to stably control the deposition rate.

SUMMARY OF THE INVENTION

There is a need for a vapor deposition method for forming an organic thin film, which is advantageous in that the deposition rate can be easily controlled and deposition can be conducted with stable high controllability. Accordingly, the present invention has been made with a view toward solving the above-mentioned problem.

The vapor deposition method for forming an organic thin film of the present invention comprises heating an organic material by irradiation with an infrared light (infrared radiation), and allowing the organic material vaporized by the heating to be deposited on a substrate.

In the vapor deposition method for forming an organic thin film of the present invention, the infrared light directly heats the organic. Therefore, the heating temperature for the organic material is arbitrarily set at about 100 to 400° C., making it possible to achieve uniform heating for the organic material.

Further, the vapor deposition apparatus for forming an organic thin film of the present invention comprises a closed container, an infrared light emitter for emitting an infrared light, a crucible for containing therein an organic material, wherein the crucible is comprised of a material capable of transmitting the infrared light, and a holder for supporting a substrate on which the organic material is deposited.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DETAILED DESCRIPTION OF THE PREFERRED EMBODIMENTS

Hereinbelow, preferred embodiments of the present invention will be described in detail with reference to the accompanying drawings.

Figure 1:
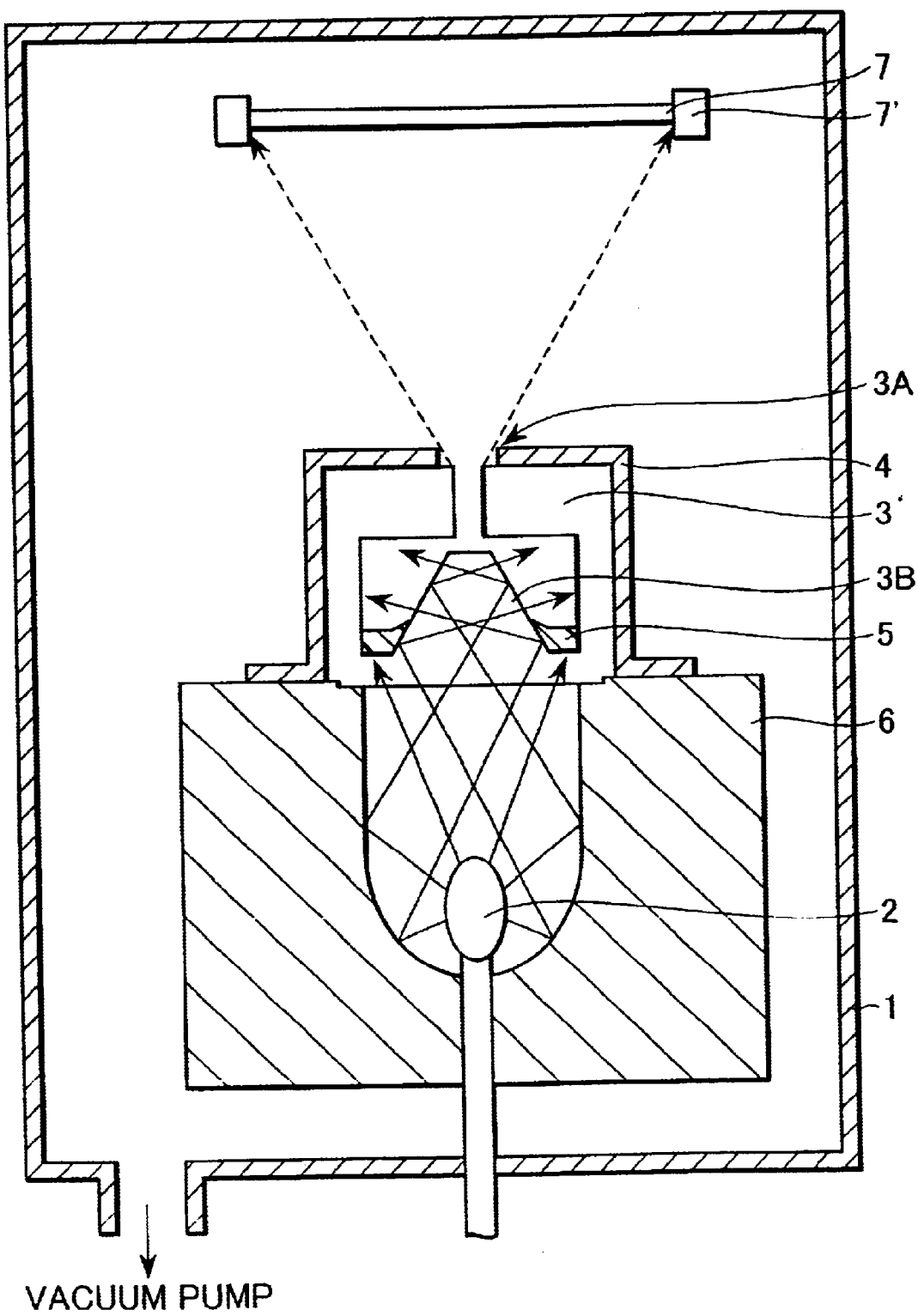
FIG. 1 is a diagrammatic view showing a vapor deposition apparatus for forming an organic thin film according to an embodiment of the present invention.

First, a vapor deposition apparatus for forming an organic thin film according to one embodiment of the present invention is described. FIG. 1 is a diagrammatic view showing a vapor deposition apparatus for forming an organic thin film. In this vapor deposition apparatus, a body is entirely contained in a closed container 1, and essentially comprises an infrared heater 2, a crucible 3, an infrared reflector mirror 4, and a supporting stand 6. In the present embodiment, the closed container 1 is connected to a vacuum pump (not shown) through a pipe, and thus a vacuum state can be created in the container. In addition, the infrared heater 2 is used for irradiating the crucible 3 with an infrared light (infrared radiation), and, as the infrared heater 2, for example, a heat source which emits infrared radiation, such as a halogen heater, is used. An infrared light has a property such that it is well absorbed by an organic substance and heats the substance. The infrared light may be condensed by means of, for example, a reflector and then be radiated to the crucible 3, and, in the present embodiment, the supporting stand 6 not only supports and fixes the crucible 3 and the infrared heater 2 but also functions as a reflector.

The crucible 3 is disposed so that it is irradiated with the infrared light from the infrared heater 2 from the bottom portion of the crucible 3, and contains therein an organic material 5 and is irradiated with the infrared light to heat and vaporize the organic material 5 contained in the crucible 3. Therefore, the crucible 3 is comprised of a material capable of transmitting the infrared light and having a heat resistance at the heating temperature (about 100 to 400° C.) for the organic material 5 to be heated. As a material for the crucible 3, quartz, Pyrex (heat-resistant glass) or the like can be used, and, in the present embodiment, quartz glass is used. Further, the crucible 3 is in a cylindrical shape and provided at an upper portion thereof with an opening portion 3A for taking out the vaporized organic material 5. In the present embodiment, on the center of the inner bottom portion of the crucible 3, the crucible 3 is provided with a projection 3B in a truncated cone shape, which has a bottom surface on the side from which the infrared radiation enters. As shown in FIG. 1, the organic material 5 is contained in the crucible 3 so as to be disposed on the bottom portion of the crucible 3. From the viewpoint of facilitating the handling, e.g., containment of the organic material 5, the crucible 3 may have a construction such that upper and lower members, for example, a pan portion and an upper lid portion are combined.

Figure 2:
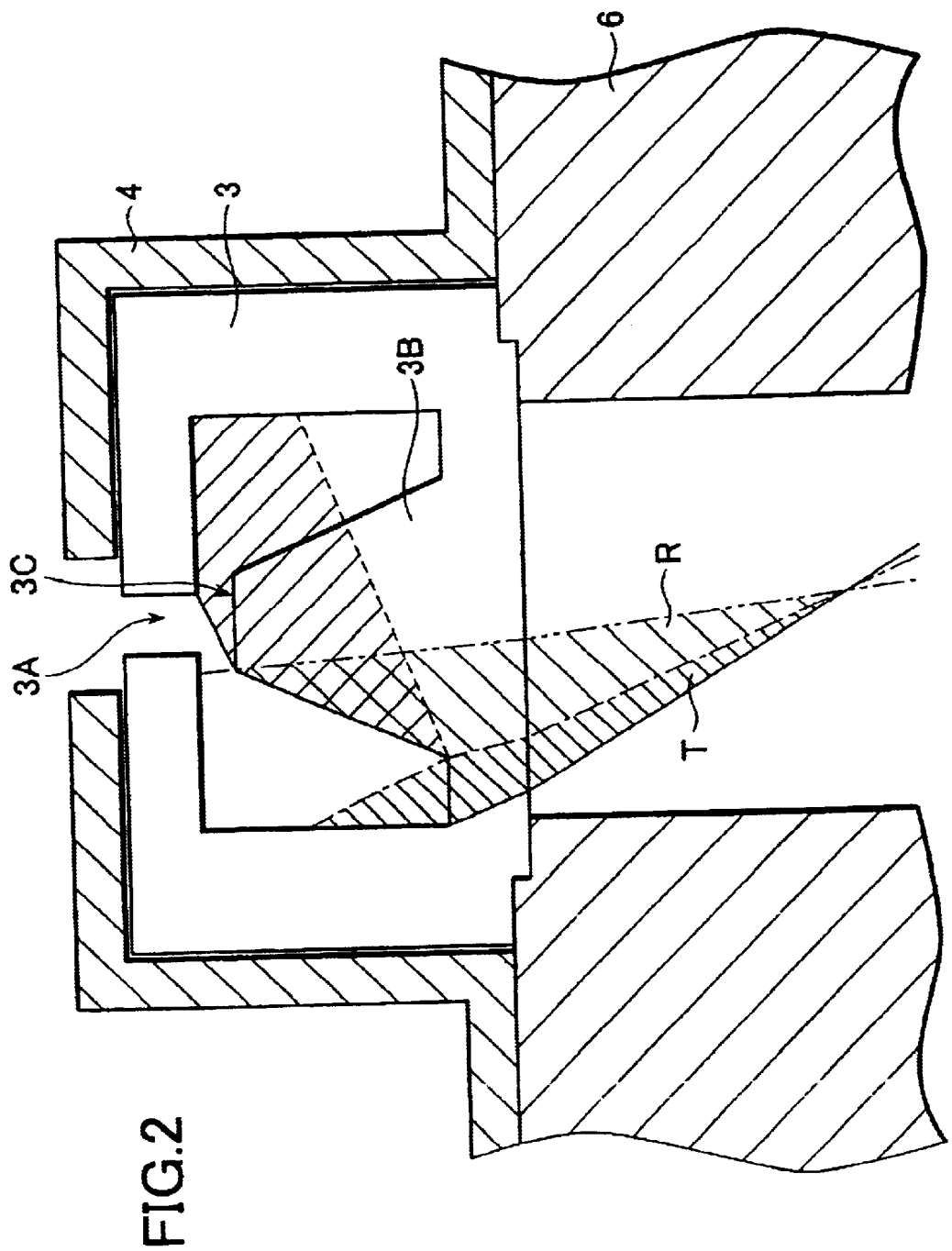
FIG. 2 is an explanatory diagrammatic cross-sectional view illustrating the construction of a crucible shown in FIG. 1.

FIG. 2 is an enlarged diagrammatic view of the crucible 3. In the present embodiment, the infrared radiation which enters the crucible 3 from the bottom portion of the crucible 3 is divided into one which has an optical path in a region T and the other which has an optical path in a region R. Among these infrared lights, the light passed through the region T transmits the bottom of the crucible 3 and enters the crucible 3, and is then radiated to the organic material 5 contained in the crucible 3. The organic material 5 is mainly heated by the light in the region T and then vaporized. On the other hand, the light passed through the region R enters the crucible 3 from the inner portion of the projection 3B, and then reflects off the sidewall of the projection 3B in a truncated cone shape and is then radiated to the inside of the crucible 3. In the present embodiment, the sidewall of the projection 3B is designed so that it makes the light in the region R undergo total reflection. Specifically, the angle of incidence of the light in the region R corresponds to a magnitude of a critical angle θ or more, determined by the following formula:

$$\sin \theta = n_1/n_2$$

wherein $n_1$ represents an index of refraction of a gas contained in the crucible 3, and $n_2$ represents an index of refraction of a material for the crucible 3, and the angle and height of the vertical angle of the projection 3B are designed so as to meet the above requirements for total reflection.

Further, the projection 3B is provided, at an upper portion thereof, with a flat surface 3C for preventing the vaporized organic material 5 from flowing out of the crucible so that the flat surface 3C is opposite to the opening 3A. In the present embodiment, the flat surface 3C has an area larger than the opening area of the opening 3A. For keeping constant the evaporation amount of the organic material 5, for example, the thickness of the upper portion of the crucible 3 may be increased so that the opening portion 3A becomes slender. In this case, it is required to design the structure so that the organic material 5 is not deposited to clog the opening portion 3A.

The infrared reflector mirror 4 surrounds the crucible 3 to prevent leakage of the infrared radiation, and is comprised of a material which well reflects infrared radiation, for example, copper (Cu) plated with gold (Au).

The organic material 5 is vaporized in the crucible 3, and released from the opening portion 3A and deposited on a substrate 7 which is supported by a substrate holder 7'. As the organic material 5, for example, there can be mentioned tris(8-quinolyl)aluminum (Alq$_3$), naphthylphenyldiamine (α-NPD), and 4,4',4"-tris(2-naphthylphenylamino)triphenylamine (2-TNATA). As the substrate 7, for example, a glass substrate is used.

Next, a vapor deposition method for forming an organic thin film using the above-mentioned vapor deposition apparatus will be described.

First, the organic material 5 in the predetermined amount is placed in the crucible 3. In the present embodiment, the organic material 5 is in a solid state at room temperature. In this instance, when the organic material 5 is placed on the flat surface 3C directly below the opening portion 3A, only the portion of the organic material 5 on the flat surface is first evaporated. Therefore, the organic material 5 is contained in the crucible 3 so that the organic material 5 is not disposed on the projection 3B but on the bottom surface of the crucible 3. Then, the crucible 3 and the substrate 7 are set in the respectively predetermined positions of the vapor deposition apparatus, and a vacuum state is created in the closed container 1 using a vacuum pump.

Then, a current is passed thorough the infrared heater 2 to start irradiation of the infrared light to the crucible 3. Among the infrared lights, the light passed through the region T (see FIG. 2) transmits the bottom of the crucible 3, and is then directly radiated to the organic material 5 contained in the crucible 3. Thus, the organic material 5 is uniformly and thoroughly heated and begins to be vaporized. In the present embodiment, the projection 3B is disposed in a position opposite to the opening portion 3A. Therefore, the particles of the vaporized organic material 5 are not released from the opening portion 3A immediately after the start of vaporization. The vaporization of the organic material 5 proceeds to a certain extent and the crucible 3 is filled with the resultant vapor in a certain amount, namely, the pressure in the crucible 3 rises, and then, the organic material 5 is released out of the crucible 3 as a vapor. Thus, not only the heating temperature for the organic material 5 but also the evaporation amount of the organic material 5 can be controlled by adjusting the dose of the infrared radiation. The irradiation dose of the infrared light is adjusted by changing the current and voltage values of the infrared heater 2. For example, a thermocouple connected to a temperature controller may be provided in the bottom portion of the crucible 3 to adjust the dose of the infrared radiation while monitoring the temperature of the organic material 5 or the periphery thereof.

During the above operation, the vapor of the organic material 5 filling the crucible 3 is frequently brought into contact with the inner sidewall or inner upper surface of the crucible 3 and then fixed thereon. For solving such a problem, among the above infrared lights, the light passed through the region R (see FIG. 2) enters the crucible 3 from the inner portion of the projection 3B, and undergoes total reflection off the sidewall of the projection 3B in a cone shape and is then radiated to the inner upper portion and inner sidewall of the crucible 3 to heat and evaporate again the organic material 5 which is solidified thereon. Further, the infrared light, which attempts to transmit the crucible 3, reflects off the infrared reflector mirror 4 and is sent back into the crucible 3, so that the crucible 3 is efficiently heated. Therefore, the organic material 5 is constantly heated uniformly in the crucible 3, and a phenomenon that the organic material once evaporated is solidified again and remains can be prevented, and the evaporation amount is controlled.

Then, when the amount of the vapor of the organic material 5 in the crucible 3 reaches an amount such that the vapor leaks from the crucible 3 through the opening portion 3A, the crucible 3 continuously releases the organic material 5 at an almost constant rate as a deposition source.

In the above-mentioned evaporation process, a rate of temperature rise and a retention temperature for the crucible 3 or the organic material 5 are controlled by adjusting the infrared dose of the infrared light. Therefore, they are appropriately set at temperatures in the range, for example, about 100 to 400° C. according to the type of the organic material 5. Thus, a desired deposition rate can be obtained.

The evaporation amount of the organic material can be monitored by means of, for example, a film thickness sensor, such as a quartz crystal oscillator monitor (not shown), provided between the crucible 3 and the substrate 7. Alternatively, a shutter (not shown) is preliminarily provided between the crucible 3 and the substrate 7, and a film thickness sensor or the like confirms that the evaporation amount of the organic material 5 reaches the predetermined amount, and the shutter is then opened, thus making it possible to control more stably the evaporation amount of the organic material 5, i.e., the deposition rate.

As mentioned above, in the present embodiment, the infrared light directly heats the organic material. Therefore, the vapor amount of the organic material 5, that is, the deposition rate can be controlled by adjusting the heating temperature for the organic material. Thus, the deposition of the organic material can be conducted at an arbitrary deposition rate in the range of temperatures as low as from 100 to 400° C.

In addition, in the present embodiment, the crucible 3 is provided with the projection 3B so that the light coming from the infrared heater 2 undergoes total reflection off the projection 3B and is then radiated to the inner sidewall and the inner upper surface of the crucible 3. Therefore, the vapor of the organic material 5 is prevented from being solidified again on the inner sidewall and the inner upper surface of the crucible 3, so that the organic material 5 is uniformly heated in the crucible 3. Further, the projection 3B is provided on the center of the bottom surface of the crucible 3 so that the projection is opposite to the opening portion 3A which is formed in the upper portion of the crucible 3. Therefore, the vaporized organic material 5 is not released from the crucible 3 immediately after the start of vaporization, but it is pushed out by pressure when an increase of the vapor of the organic material 5 causes the pressure in the crucible 3 to reach a certain pressure. Thus, the vapor amount of the organic material released can be kept constant at a constant heating temperature.

Further, the light in the region R undergoes total reflection off the projection 3B, and hence, the amount of the light which goes toward the substrate 7 from the opening portion 3A of the crucible 3 is reduced, so that the substrate 7 can be prevented from being heated by the infrared light.

EXAMPLES

The present invention will be described in more detail with reference to the following Examples.

Example 1

(Control of Deposition Rate)

A crucible (outer diameter: 30 mm; height: 25 mm) made of quartz having the same shape as that of the crucible used in the above-mentioned embodiment was provided, and a thermocouple for temperature measurement was inserted to the bottom portion of the crucible. Then, an infrared lamp (halogen heater unit, manufactured and sold by USHIOLIGHTING, INC., Japan) and a cold miller were disposed so that the infrared light emitted from the lamp was condensed by the miller. As an organic material to be deposited, tris(8-quinolyl)aluminum (Alq$_3$) was used, and contained in the crucible, and, as a substrate for deposition, a glass substrate was provided.

Then, the bottom portion of the crucible was irradiated with infrared radiation from the infrared lamp to conduct deposition. In this instance, the temperature of the crucible was adjusted by monitoring the thermocouple, and the crucible temperature was changed within the range of from 110 to 180° C. and a film forming rate (that is, a deposition rate) was simultaneously measured by means of a film thickness monitor.

Figure 3:
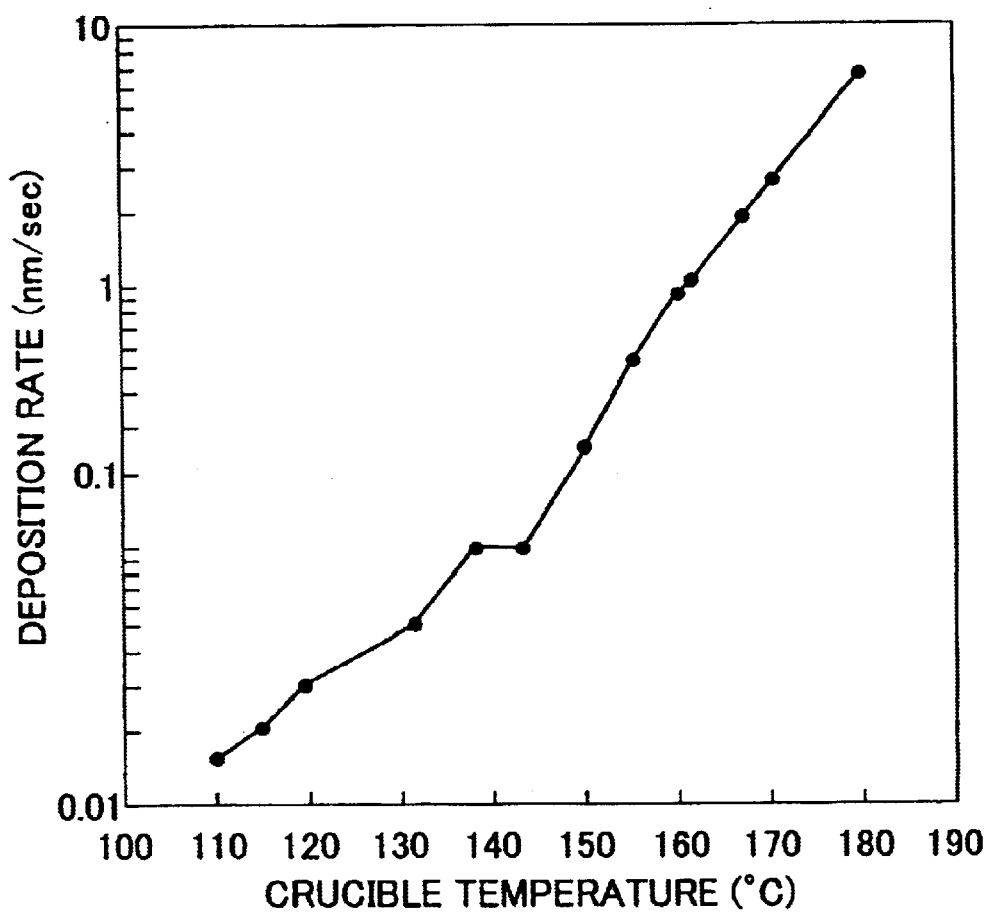
FIG. 3 is a graph showing the change of a deposition rate with the temperature of the crucible in the Example of the present invention.

FIG. 3 shows the results of the measurements of the crucible temperature and the deposition rate. From the results, it is found that the deposition rate is substantially linearly proportional to the temperature of the crucible. The optimum deposition rate of an organic thin film is told to be about 0.1 to 0.5 nm/sec (C. W. Tang, S. A. VanSlyke, C. H. Chen, J. Appl. Phys., 65, 3610 (1989)), and, in the present example, the deposition rate could be controlled in the range of from 0.01 to 10 nm/sec, which involves the above range of the deposition rate, by adjusting the temperature of the crucible within the range of temperatures as low as 100 to 200° C. The deposition rate was almost constant while the crucible temperature was kept constant.

Examples 2 and 3
(Preparation of Organic EL Device)

Figure 4:
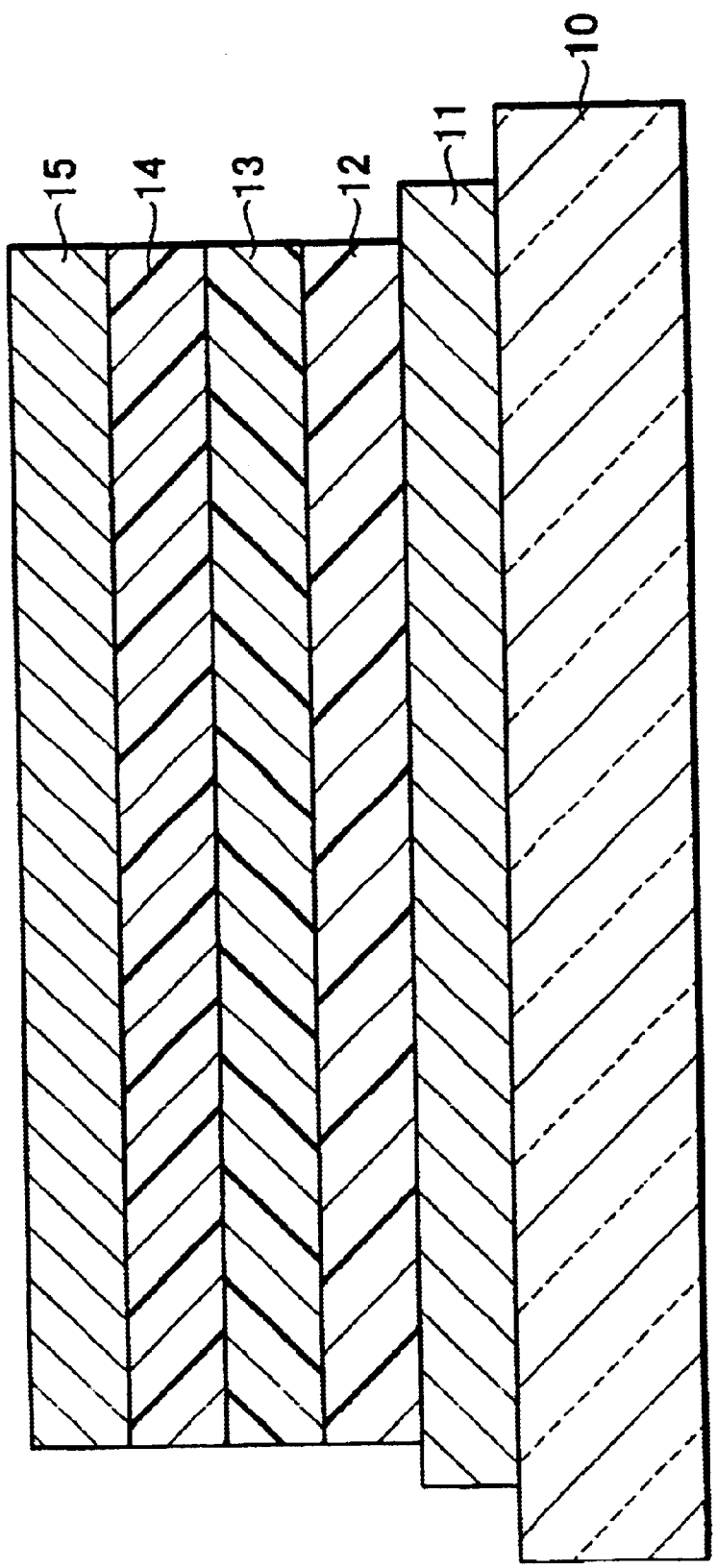
FIG. 4 is a diagrammatic view showing the construction of an organic EL device in the Example of the present invention.

FIG. 4 shows the construction of the organic EL device prepared. First, an ITO layer 11, which serves as an electrode, was deposited on a glass substrate 10 (Corning 1737) so that the thickness became about 250 nm. The sheet resistance of the ITO layer 11 was about 10 to 20 Ω/□.

Then, the glass substrate 10 was washed, and organic thin films were deposited thereon and stacked on one another using the same vapor deposition apparatus as that used in Example 1. Specifically, a 2-TNATA layer 12, an α-NPD layer 13, and an $Alq_3$ layer 14 were deposited. These layers were deposited in the same vacuum chamber, and the degree of vacuum during the deposition was set at $8.5 \times 10^{-5}$ Pa or less. The 2-TNATA layer 12 and the α-NPD layer 13 were deposited at a deposition rate of 0.1 nm/sec. The $Alq_3$ layer 14, which serves as a light emission layer, was deposited at a deposition rate of 0.1 nm/sec in Example 2 and at a deposition rate of 1.0 nm/sec in Example 3. The thicknesses of these layers were respectively 30 nm, 20 nm, and 50 nm.

Finally, aluminum (Al) was deposited on the $Alq_3$ layer 14 by a sputtering process to form an Al layer 15 in a thickness of 150 µm, which serves as an electrode.

Figure 5:
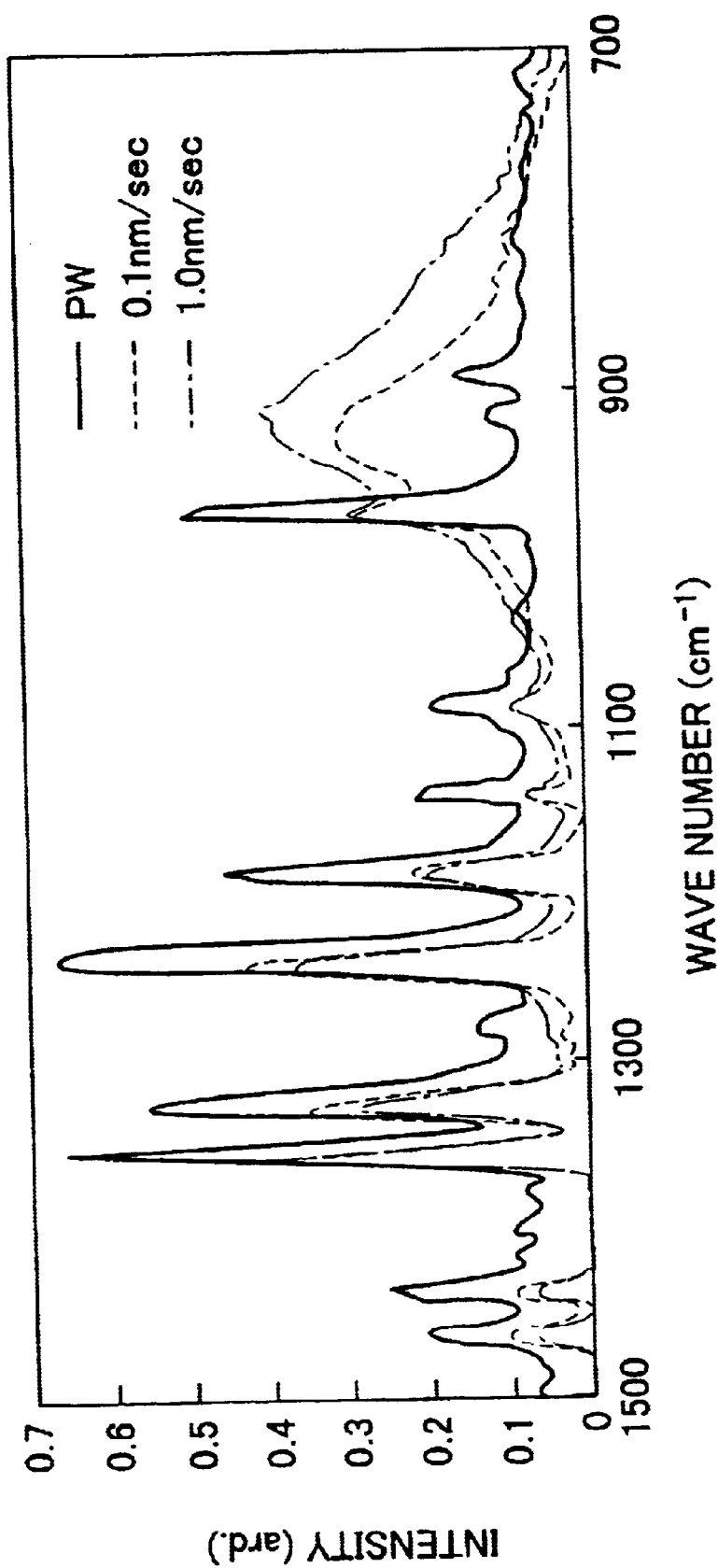
FIG. 5 is a chart showing the results of the FTIR measurement for a light emission layer of the organic EL device in FIG. 4.

With respect to each of the organic EL devices in which $Alq_3$ layers 14 as light emission layers were formed at different deposition rates in Example 2 (0.1 nm/sec) and Example 3 (1.0 nm/sec), a Fourier transform infrared spectroscopy (FTIR) measurement for the $Alq_3$ layer 14 was conducted. For comparison, with respect to powdery $Alq_3$ which was not deposited, an FTIR measurement was conducted. The results of the measurements are shown in FIG. 5. From the results, it is found that almost all the peaks of FTIR were consistent between the deposition films in Examples 2 and 3 and the powdery $Alq_3$, and hence the deposition films are excellent in film quality. Further, at wave numbers in the range of from 800 to 1,000 $cm^{-1}$, both the deposition films in Examples 2 and 3 have a broad peak which is not found in the peaks of the powdery $Alq_3$. This broad peak is considered to be ascribed to the form of the test specimen, i.e., the form of thin film rather than the material of $Alq_3$. Furthermore, comparison is made between Example 2 and Example 3. The peak intensities in Example 2, in which the deposition rates are smaller than those in Example 3, are slightly higher than those in Example 3 as a whole, whereas, the intensity of the broad peak in Example 3 is higher than that in Example 2. This result suggests that the deposition rate affects the quality of the resultant film.

Figure 6:
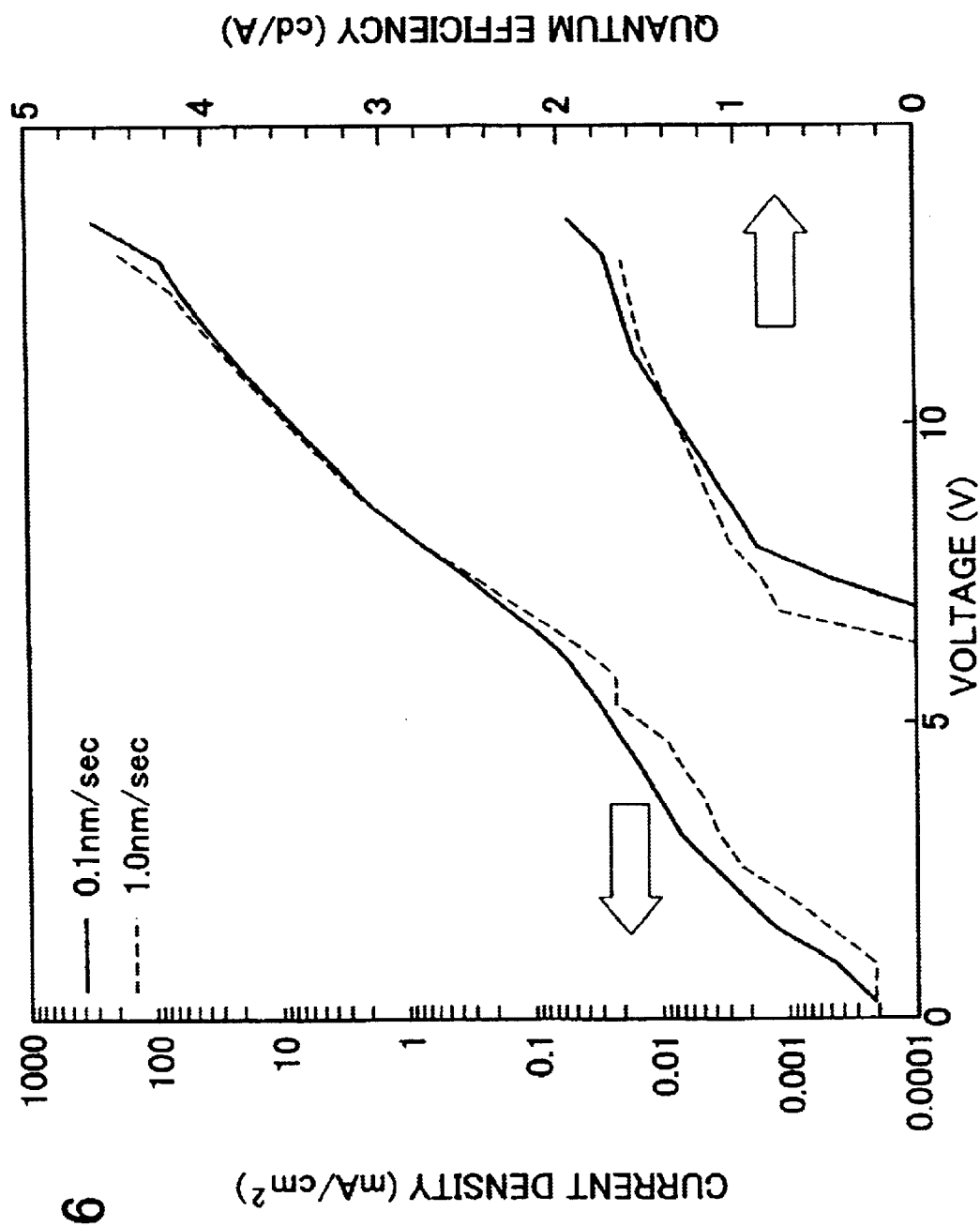
FIG. 6 is a graph showing the results of the measurements of the electrical properties for the organic EL device in FIG. 4.

Next, with respect to each of the organic EL devices in Example 2 and Example 3, electrical properties were examined. FIG. 6 shows the results of the measurements of the change of each of the quantum efficiency and the current density with the voltage. From the results, it is found that, in each of Examples 2 and 3, the quantum efficiency and the current density exhibit voltage dependence at almost the same degree, and the deposition rate or film quality of the $Alq_3$ layer is not largely affected by the properties of the device. Both the devices in these Examples emitted a green light at a light emission wavelength of 520 nm, and exhibited a maximum luminance of about 3,000 $cd/M^2$.

Thus, organic EL devices could be actually prepared, and the properties of the deposition films prepared at different deposition rates were examined, and it was confirmed that an optimization of the conditions for deposition can be achieved.

Hereinabove, the present invention was described with reference to the embodiments and examples, but the present invention is not limited to these embodiments and examples but can be modified. For example, in the above embodiment, the organic material 5 is contained in the crucible 3 and then heated, but, for preventing the organic material 5 from being contacted with moisture, the empty crucible 3 may be dehydrated, for example, by a pretreatment at 100° C. for about 10 minutes.

In addition, in the above embodiment, the crucible 3 is provided with the projection 3B in a cone shape, which has the flat surface 3C at the upper end thereof, inside the crucible. However, the crucible may be provided with a projection which does not have the flat surface 3C but a pointed tip, and, alternatively, the crucible may not be provided with such a projection. Further, in the above embodiment, as the organic material 5, a substance capable of being sublimated is used, but a substance which is first liquefied and then vaporized may be used. In such a case, a vapor is not vigorously generated, and hence, the vapor amount of the organic material can be controlled even when using a crucible provided with no projection.

Further, in the above embodiment, only one deposition source comprising the infrared heater 2 and the crucible 3 is provided per vapor deposition apparatus, but, for example, a plurality of deposition sources may be provided in parallel lines.

Although the invention has been described in its preferred form with a certain degree of particularity, obviously many changes and variations are possible therein. It is therefore to be understood that the present invention may be practiced otherwise than as specifically described herein without departing from the scope and the sprit thereof.

What is claimed is:

1. A vapor deposition apparatus for forming an organic thin firm, said apparatus comprising:
   a closed container;
   an infared light emitter for emitting an infared light;
   a crucible for containing therein an organic material, said crucible comprised of a material capable of transmitting infared radiation; and
   a holder for supporting a substrate on which said organic material is deposited, wherein said crucible is provided with a projection portion inside said crucible on a side from which the infared light enters, and wherein said projection portion is in a cone shape.

2. The vapor deposition apparatus according to claim 1, wherein said projection portion has a flat surface at a tip portion thereof.

3. The vapor deposition apparatus according to claim 2, wherein said crucible is provided with an opening for taking out the vaporized organic material in a position opposite to said projection portion in a cone shape, and wherein said flat surface has an area larger than an opening area of said opening.

4. The vapor deposition apparatus according to claim 1, wherein said crucible is surrounded by an infrared reflector mirror.

* * * * *